United States Patent [19]
Kai

[11] Patent Number: 5,679,493
[45] Date of Patent: Oct. 21, 1997

[54] METHOD OF PRODUCING AN ASSEMBLY INCLUDING AN ANISOTROPIC CONDUCTIVE FILM

[75] Inventor: Takanobu Kai, Tokyo, Japan

[73] Assignee: NEC Corporation, Tokyo, Japan

[21] Appl. No.: 538,118

[22] Filed: Oct. 2, 1995

[30] Foreign Application Priority Data

Sep. 30, 1994 [JP] Japan .................. 6-236562

[51] Int. Cl.$^6$ .................... G03G 13/22
[52] U.S. Cl. ...................... 430/126; 430/20
[58] Field of Search ............... 430/126, 20

[56] References Cited

U.S. PATENT DOCUMENTS

| | | | |
|---|---|---|---|
| 3,561,957 | 2/1971 | Perry | 430/31 |
| 4,337,303 | 6/1982 | Sahyun et al. | 430/126 |
| 4,456,679 | 6/1984 | Leyrer et al. | 430/326 |
| 5,304,447 | 4/1994 | Svendsen et al. | 430/137 |

FOREIGN PATENT DOCUMENTS

| | | |
|---|---|---|
| 51-100679 | 9/1976 | Japan . |
| 58-21350 | 2/1983 | Japan . |
| 59-191395 | 10/1984 | Japan . |
| 60-126889 | 7/1985 | Japan . |
| 3-62411 | 3/1991 | Japan . |

*Primary Examiner*—Roland Martin
*Attorney, Agent, or Firm*—Young & Thompson

[57] ABSTRACT

A packaging glass mask is used for local exposure to light on a photo conductive layer which is insulative and becomes conductive upon exposure to light. This results in elimination of charge on the exposed surface of the photo conductive layer to form a charged pattern in accordance with a packaging pattern. Each conductive particle consisting of a core insulator coated with plating of a conductive material is then distributed on the surface of the photo conductive layer. The conductive particles are deposited in a concentrated manner on charged sections of the photo conductive layer. An insulating resin is then laid on the conductive particles by application or transfer to complete an anisotropic conductive film with the conductive particles selectively distributed therein in accordance with the packaging pattern.

3 Claims, 6 Drawing Sheets

METHOD OF PRODUCING AN ASSEMBLY INCLUDING AN ANISOTROPIC CONDUCTIVE FILM

BACKGROUND OF THE INVENTION

The present invention relates to a method of manufacturing an anisotropic conductive film and, more particularly, to a method of manufacturing such a film which is used for a liquid crystal display device.

In a liquid crystal display, an anisotropic conductive film is used to establish connections between terminal pads of a liquid crystal display panel and electrodes of integrated circuit devices for driving the panel (called hereinafter "driving ICs"). In general, such an anisotropic conductive film includes an anisotropic conductive adhesive layer which is manufactured by dispersing fine particles of a metal such as copper or nickel in an adhesive while controlling the content, shape, size, etc. When this film is applied selectively with a certain level of pressure, an electrical connection is selectively established in its width or vertical direction while keeping insulation in its horizontal or surface direction. Since this film may be prepared by printing an adhesive thoroughly mixed with particles on a wiring board and may be bonded in a phase-down state, a plurality of bonding pads may be bonded at one time. In addition, since the driving ICs using this film do not need bumps, their costs may be reduced.

There have been proposed some methods of establishing connections for electronic parts or IC chips by Japanese Laid-open Patent Application No. SHO 51-100679 and Japanese Laid-open Patent Application No. SHO 58-21350. The methods disclosed therein have, however, problems that isolation between adjacent electrodes is impaired as the connection density increases and that the connection resistance increases due to the fewer number of conductive particles which contribute to the connections, because the areas of the connection sections decrease.

As a solution to such problems, an anisotropic conductive film with conductive particles unevenly distributed therein is disclosed in Japanese Laid-open Patent Application No. HEI 3-62411. The method of manufacturing the film comprises applying an adhesive to sections on which conductive particles are desired to be concentrated, placing a grounded electrode under each of the sections, and injecting conductive particles which have been charged by passage through a corona electrical field into sections of the adhesive which are not masked by an insulating mask, to unevenly distribute the conductive particles. However, this has a problem of difficulty of fine alignment because electrodes placed along the wiring pattern and an insulating mask are required.

On the other hand, Japanese Laid-open Patent Application No. HEI 60-126889 describes a method of manufacturing an anisotropic conductive film with conductive particles unevenly distributed therein, which comprises exposing a photosensitive resin to light to create cured and uncured sections thereof, etching off the uncured sections to create insulating patterns, charging the insulating patterns by corona discharge or friction with a magnetic brush to form electrostatic patterns, depositing conductive particles on the electrostatic sections, applying an adhesive thereto and peeling off both the adhesive and the conductive particles to form an anisotropic conductive film. However, this also has a problem in that the steps are complicated because of the need to expose a photosensitive resin to light to create cured and uncured sections, and etch off the uncured sections.

A method of dispersing conductive particles on the surface of a board is also described in Japanese Laid-open Patent Application No. SHO 59-191395. This method is, however, for manufacture of a ceramic wiring board by metallization with copper on a ceramic board, and thus has no bearing on the anisotropic conductive film according to the present invention.

SUMMARY OF THE INVENTION

It is an object of the present invention to form an anisotropic conductive film using fewer steps.

A method of manufacturing an anisotropic conductive film according to the present invention is characterized by comprising the steps of providing a photo conductive layer which changes from insulating to conductive upon irradiation with light, locally irradiating the photo conductive layer with light, distributing conductive particles in the sections not irradiated of the photo conductive layer, and providing an insulating layer on the photo conductive layer to load the conductive particles into the insulating layer.

According to the preferred embodiment, the step of distributing the conductive particles is performed by charging the entirety of the insulating photo conductive layer, selectively exposing the photo conductive layer to light with a given glass mask to eliminate charge on the surface and in the inside of the light-irradiated regions, and distributing oppositely charged conductive particles on the still-charged sections of the photo conductive layer by an electrical attracting force.

According to the preferred embodiment, a given glass mask is a packaging glass mask provided with light-transmitting conductive wiring. The photo conductive layer is characterized by being polyethylene terephthalate (PET) or polytetrafluoroethylene (PTFE). The conductive particles each characteristically consist of a core insulator coated with plating of a conductive material.

BRIEF DESCRIPTION OF THE DRAWINGS

The above and other objects, advantages and features of the present invention will be more apparent from the following description taken in conjunction with the accompanying drawings, in which:

FIGS. 4A and 4B are fragmentary plan view of the glass mask shown in FIG. 1, wherein FIG. 4A shows a special-purpose photo glass mask, and FIG. 4B shows a packaging glass mask;

DETAILED DESCRIPTION OF THE PREFERRED EMBODIMENTS

Figure 1A:
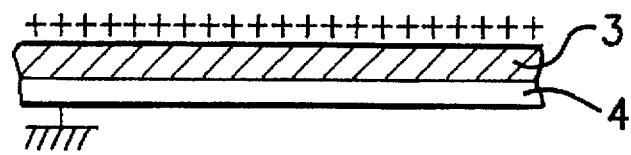
FIGS. 1A, 1B, and 1C are cross section views showing respective steps of a method of a manufacturing an anisotropic conductive film according to an embodiment of the present invention.

As shown in FIG. 1A, a photo conductive layer 3 such as polyethylene terephthalate (abbr.: PET, transparent) or polytetrafluoroethylene (abbr.: PTFE, white translucent) is laid on a plate 4 of a metal such as copper to a thickness on the order of 20 µm. PET and PTFE have such properties as to be electrically insulating when not exposed to light and to become electrically conductive upon exposure to light. This type photo conductive layer 3 has the advantage of being cheaper than conventional photosensitive resins. The metal plate 4 is grounded and has a thickness of 100 µm or more. The surface or the inside of the photo conductive layer 3 is charged by corona discharge, etc.; FIG. 1A illustrates a positively charged state of the photo conductive layer 3. The amount of charge is approximately 0.5 kV in terms of the surface voltage. The photo conductive layer may be negatively charged.

Figure 1B:
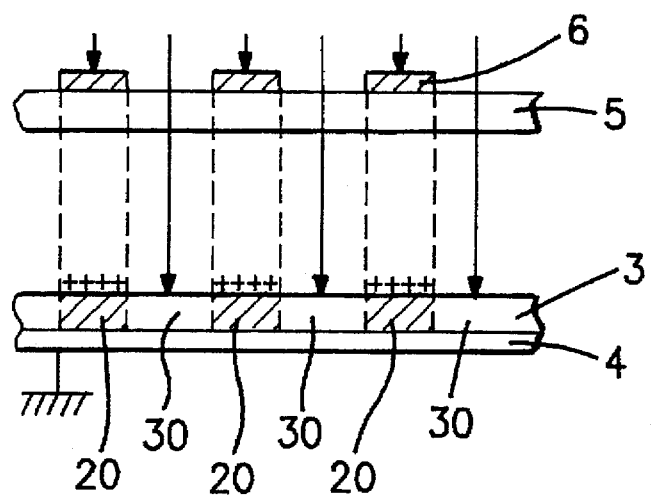

Then, as shown in FIG. 1B, light is applied to the photo conductive layer 3 through an approximately 1.1 mm-thick glass mask 5. Upon exposure of the photo conductive layer 3 selectively to the light, the exposed regions 30 and the changed regions 20 is pattern on the photo conductive layer 3. The exposed regions 30 change to electric conductors, and charge on the surface or in the inside is lost by discharge or through the metal plate 4 when the light enters the photo conductive layer 3. A charged pattern 30 is formed in this way tracing the pattern of the glass mask 5.

Figure 4A:
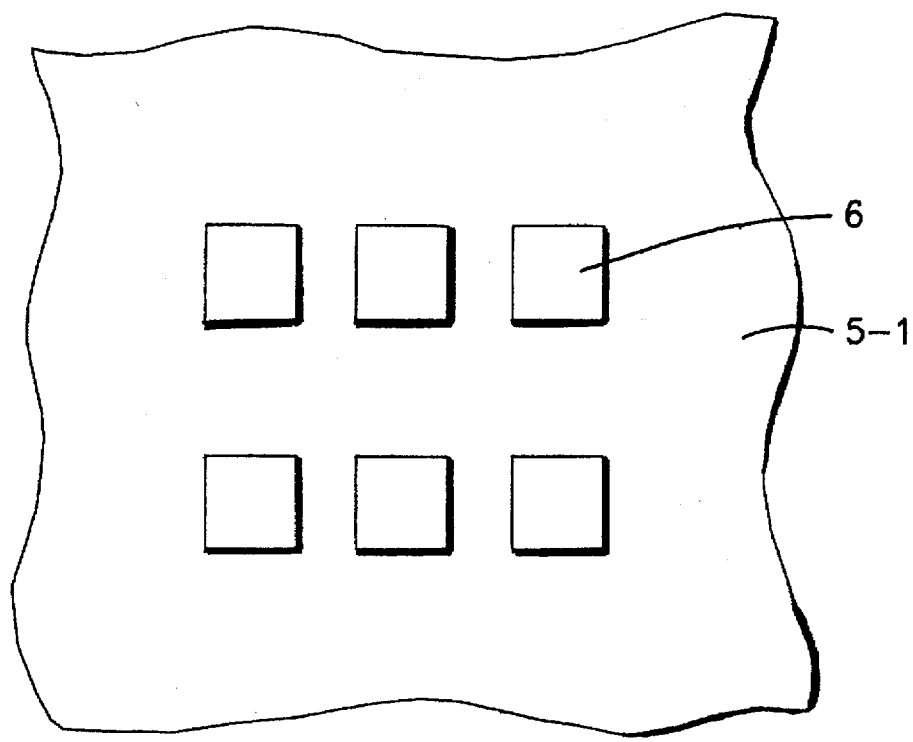
Figure 4B:
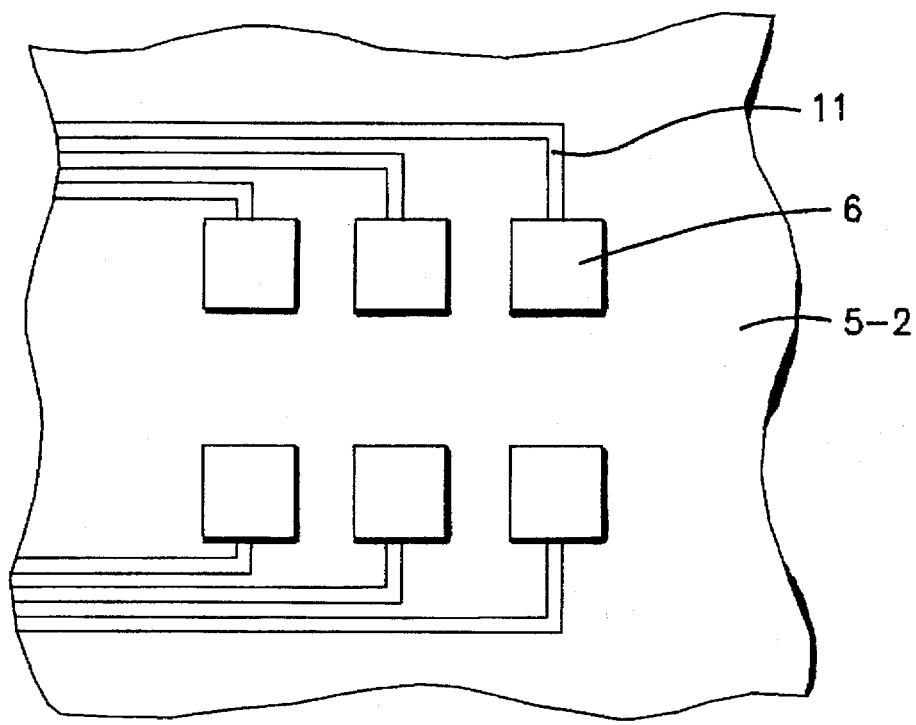

The glass mask 5 used is the one shown in FIG. 4A or FIG. 4B. FIG. 4A shows a special-purpose photo glass mask 5-1. Shading patterns 6 are formed on the glass mask 5-1 in accordance with packaging patterns, for example, bonding patterns. The shading patterns 6 are composed of chromium which is laid to a thickness on the order of 300 nm and does not transmit light. As a result, only light which has passed through sections other than the shading patterns 6 impinges on the surface of the photo conductive layer 3. In addition, according to the present invention, the packaging glass mask 5-2 shown in FIG. 4B may be used as well. This glass mask 5-2 is a completed, packaging glass mask outfitted with all the wiring necessary for a liquid crystal display, and also equipped with shading patterns and light-transmitting, conductive patterns 11 composed of ITO. These ITO wires are drive wires or leads of a liquid crystal panel which are connected to gates or drains of respective memory cells. Since the output ends may be of high resistance (e.g., 1 kΩ), high-resistance ITO may be used with advantages. On the other hand, at the input ends the gate wires are composed of a metal such as chromium and connected to the ITO wires in regions other than at an anisotropic conductive film. Since the packaging glass mask also serves as a photomask, there is no need to form a special-purpose photo glass mask for each packaging pattern, thus reducing the cost and allowing formation of a more precise mask pattern.

Figure 1C:
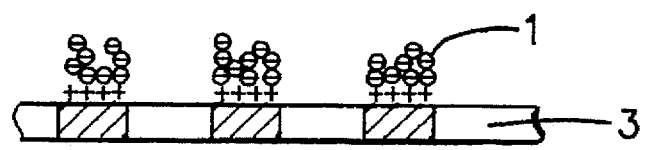
Figure 2A:
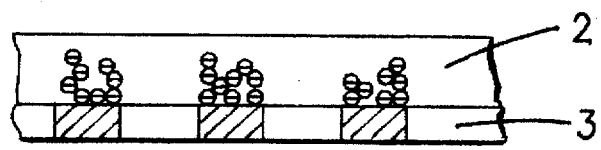
FIGS. 2A and 2B are cross section views showing respective steps of another method of manufacturing an anisotropic conductive film according to an embodiment of the present invention.
Figure 2B:
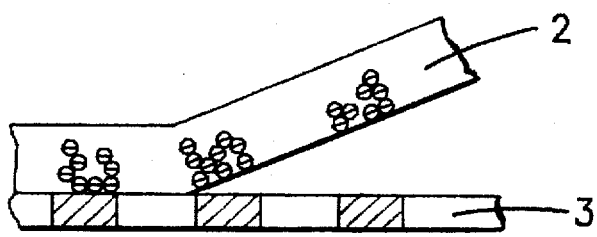
Figure 3A:
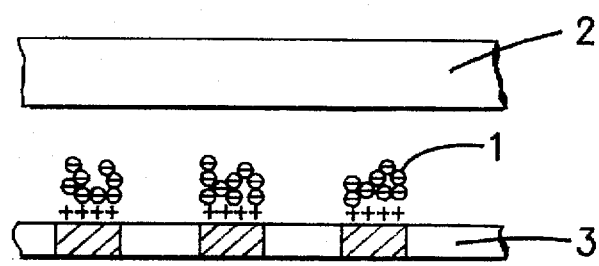
FIGS. 3A and 3B are cross section views showing respective steps of an additional method of manufacturing an anisotropic conductive film according to an embodiment of the present invention.
Figure 3B:
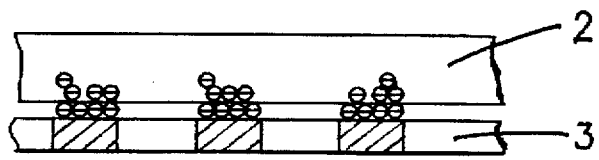
Figure 5:
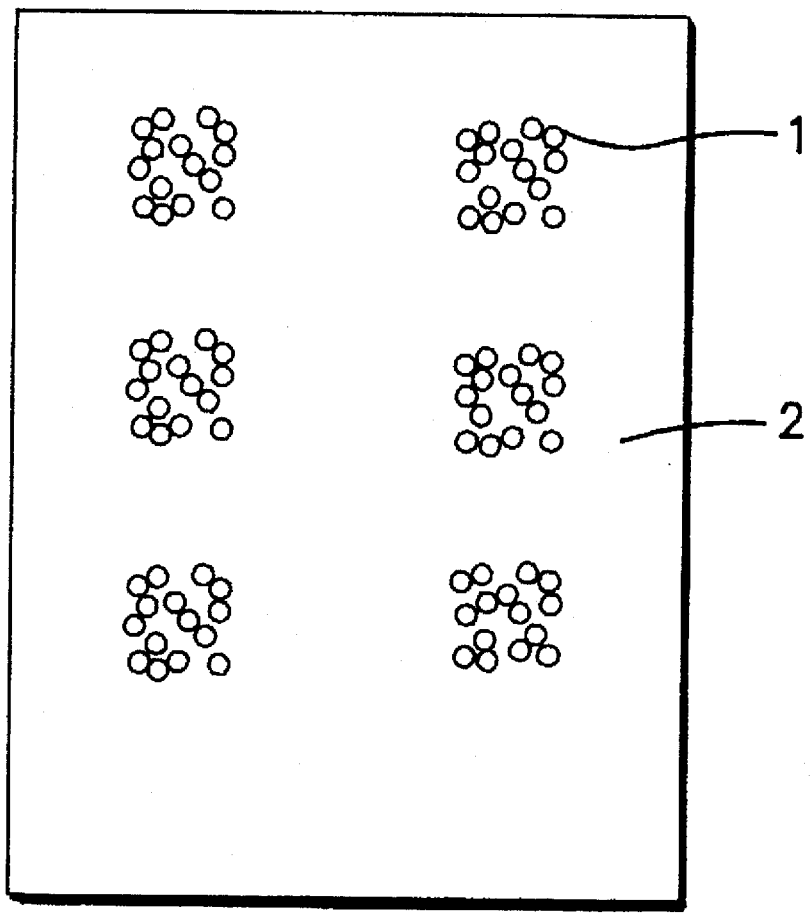
FIG. 5 is a fragmentary plan view of an anisotropic conductive film manufactured according to the present invention.

Then, as shown in FIG. 1C, charged, conductive particles 1 with an average diameter of 5 µm are scattered on the photo conductive layer 3 bearing charged patterns. The conductive particles 1 are charged opposite to the photo conductive layer 3, i.e., negatively in this case. The conductive particles each consist of a core insulator coated with plating of a conductive material such as nickel or gold. Therefore, the conductive particles are more readily charged and thus may be manufactured at lower costs than other metal spheres. The conductive particles 1 are concentrated on the charged sections of the photo conductive layer 3 by an electrical attracting force. An insulating resin 2 is applied as shown in FIG. 2 or transferred as shown in FIG. 3 onto the conductive particles 1 to a thickness on the order of 20 µm to form an anisotropic conductive film with the conductive particles unevenly distributed therein in accordance with a specific packaging pattern. In cases where the insulating resin 2 is applied, the insulating resin 2 is applied as a paste onto the photo conductive layer 3 and the conductive particles 1 shown in FIG. 1C using a dispenser or the like. Here, the pasty insulating resin 2 spreads to envelopes the conductive particles 1 on the vehicle 3 until it reaches the state as shown in FIG. 2A. Thereafter, the insulating resin 2 is peeled off from the substrate 3 as shown in FIG. 2B to complete the anisotropic conductive film. In cases where the insulating resin 2 is transferred, the insulating resin 2 shown in FIG. 3A is allowed to stand as a wet film on the substrate film. Then, the wet film is laid on the photo conductive layer 3 and the conductive particles 1 shown in FIG. 1C under a slight pressure. Since the insulating resin 2 is not yet dried, the conductive particles 1 penetrate into the film of the insulating resin 2 or are deposited on its surface until it reaches the state as shown in FIG. 3B. FIG. 5 is a top view of the completed anisotropic conductive film shown in FIG. 2B or FIG. 3B.

Figure 6A:
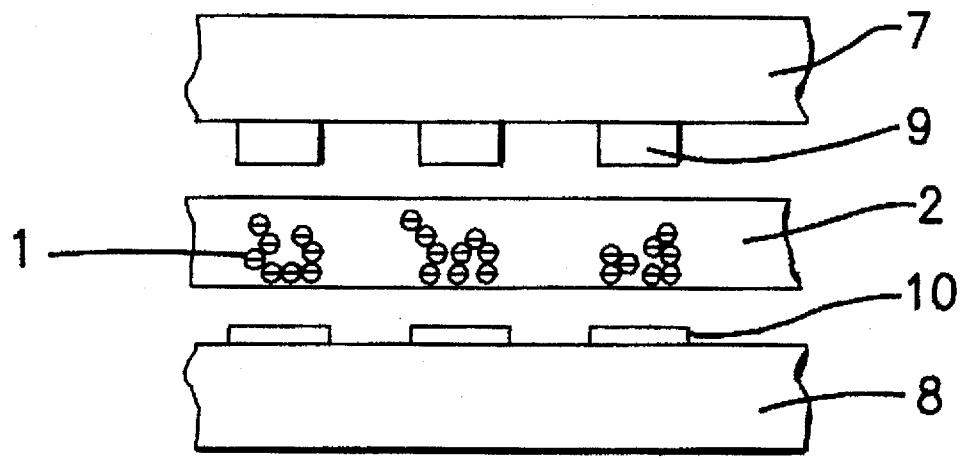
FIGS. 6A and 6B are cross section views showing respective steps of connecting a liquid crystal display panel and a driving IC chip which is composed of an anisotropic conductive film manufactured according to the present invention.
Figure 6B:
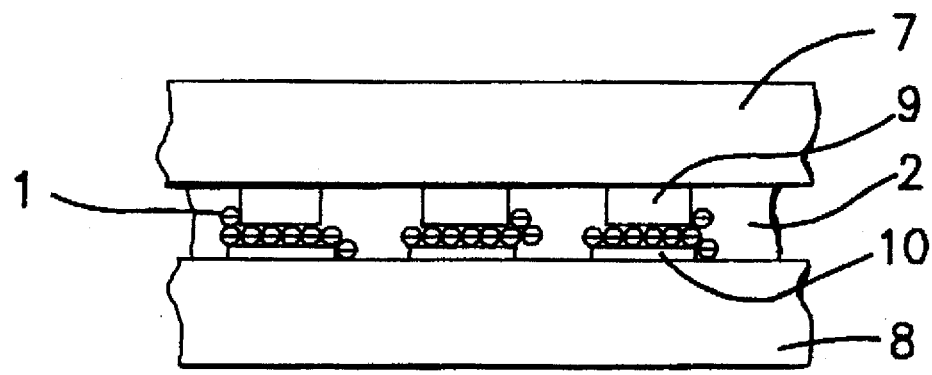
Figure 7:
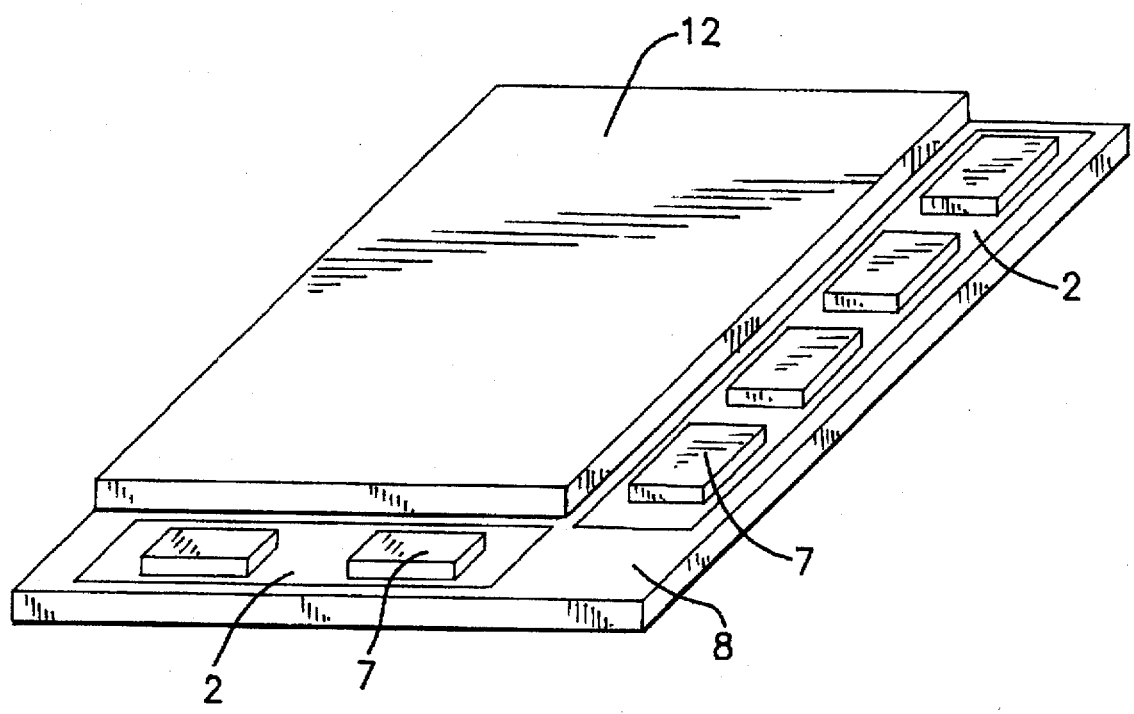
FIG. 7 is a perspective view showing a liquid crystal display device using an anisotropic conductive film manufactured according to the present invention.

As shown in FIG. 6A, a driving IC 7 is provided with driving IC-connecting electrodes 9 with a height on the order of 20 µm. In addition, the liquid crystal display panel 8 is the packaging glass mask mentioned above, equipped with approximately 300–400 nm-high liquid crystal display panel-connecting electrodes 10 placed facing the driving IC-connecting electrodes 9. The liquid crystal display panel 8 and the driving IC 7 are aligned and connected with pressure and heat so as to sandwich an approximately 25–30 µm-thick anisotropic conductive film 2. Upon application of heat to approximately 150° C., the thermosetting epoxy resin composing the anisotropic conductive film 2 is liquefied as the temperature increases and fills the gaps between the liquid crystal display panel-connecting electrodes 10 and the driving IC-connecting electrodes 9. The epoxy resin is allowed to stand for complete setting. By application of pressure, conductive particles 1 arranged in a roughly single layer are sandwiched between the liquid crystal display panel-connecting electrodes 10 and the driving IC-connecting electrodes 9 to establish electrical connections between them, as shown in FIG. 6B. The epoxy resin almost completely pots the electrodes individually to ensure electrical isolation between them. As shown in FIG. 7, provided on the surface of the liquid crystal display panel 8 is another liquid crystal display panel 12 which is smaller than the liquid crystal display panel 8 and has two adjacent sides flush with it. This liquid crystal display panel 12 is the liquid crystal display section. The narrow anisotropic conductive film 2 extends across the exposed outer regions of the liquid crystal display panel 8. A plurality of driving ICs 7 are provided on the anisotropic conductive film 2, each electrically connected to the liquid crystal display panel 8. The driving ICs 7 placed along the short side of the liquid crystal display panel 8 mainly serve as gate control ICs for the liquid crystal matrix (not shown), while the driving ICs placed along the long side of the liquid crystal display panel 8 are lead control ICs for the liquid crystal matrix.

As explained above, according to the present invention, since conductive particles are unevenly distributed in accordance with packaging patterns, high-level insulation of the gaps and low resistance of the connecting sections may be ensured even if terminal pads of a liquid crystal panel and driving ICs are connected with small pitches of 100 µm or less, for example. This results in decreased frequencies of gap shorts and connection faults of terminals of from 10% to 1%, and from 1% to 0%, respectively, and allows establishment of high-reliability, high-yield connections at small pitches of 100 μm or less. In addition, since the anisotropic conductive film according to the present invention is composed of a photo conductive layer which is naturally insulating and becomes conductive upon exposure to light, both insulating and conductive regions may be formed by mere exposure to light, and thus there is provided the advantage of fewer steps.

Although the preferred embodiment of the present invention has been described in detail, it should be understood that various changes, substitution and alteration can be made therein without departing from the spirit and scope of the invention as defined by the appended claims. As an example, although the foregoing explanation regards a case where the number of the electrodes of each IC chip is 6, the number is obviously not limited thereto. In addition, the wiring 11 on the glass mask is not required to have the configuration shown in FIG. 4B.

What is claimed is:

1. A method of manufacturing an assembly including an anisotropic conductive film, comprising the steps of:

providing a photo conductive layer which changes from insulative to conductive upon irradiation with light;

electrically charging an entire portion of said photo conductive layer;

exposing said photo conductive layer to light by using a transparent substrate as a mask, thereby to maintain the electrical charge of a plurality of first sections within said entire portion but to eliminate the electrical charge of the rest of said entire portion, said transparent substrate having thereon an electrically conductive pattern comprising a plurality of terminals each of which blocks light from passing therethrough, said terminals being spaced apart from each other;

distributing conductive particles substantially only on said charged first sections of said photo conductive layer by an electrical attracting force;

providing an insulating layer on said photo conductive layer to load said conductive particles in said insulating layer thereby to form an anisotropic conductive film of which only spaced portions are loaded with said conductive particles; and sandwiching said anisotropic conductive film between said transparent substrate and a semiconductor device having electrodes in alignment both with said spaced portions loaded with conductive particles and with said terminals.

2. The method as claimed in claim 1, wherein each said conductive particle consists of a core insulator coated with plating of a conductive material.

3. The method as claimed in claim 1, wherein said photo conductive layer is polyethylene terephthalate or polytetrafluoroethylene.

* * * * *